United States Patent [19]
Faulkner et al.

[11] Patent Number: 4,837,498
[45] Date of Patent: Jun. 6, 1989

[54] METHOD AND APPARATUS FOR SETTING THE SIGNAL-TO-NOISE RATIO OF A CARRIER WAVE

[75] Inventors: Thomas R. Faulkner, Veradale; Earl C. Herleikson, Otis Orchards, both of Wash.

[73] Assignee: Hewlett-Packard Company, Palo Alto, Calif.

[21] Appl. No.: 102,184

[22] Filed: Sep. 29, 1987

[51] Int. Cl.$^4$ .............................................. G01R 27/28
[52] U.S. Cl. .................................................... 324/57 N
[58] Field of Search ............... 324/57 N; 455/67, 115, 455/116, 249, 250, 226; 370/17

[56] References Cited

U.S. PATENT DOCUMENTS

| | | | |
|---|---|---|---|
| 2,773,186 | 12/1956 | Herrmann, Jr. .................. | 324/57 N |
| 3,683,282 | 8/1972 | D'Amato et al. ................ | 324/57 N |
| 4,742,561 | 5/1988 | Tipton ............................. | 324/57 N |

Primary Examiner—Gerard R. Strecker
Assistant Examiner—Anthony L. Miele
Attorney, Agent, or Firm—Leslie G. Murray

[57] ABSTRACT

A signal source which provides a carrier signal having a precisely set signal-to-noise ratio is provided. The carrier signal and its sideband noise components are attenuated below the equivalent thermal noise floor of an attenuator. The attenuated carrier signal and the equivalent thermal noise floor are then amplified in an amplifier having a known noise figure to produce a composite carrier signal having a usable power level and a precisely known signal-to-noise ratio. Since the equivalent thermal noise floor is a function only of temperature, the desired carrier signal-to-noise ratio may be set by setting the power level of the carrier signal and knowing the noise figure of the amplifier.

12 Claims, 2 Drawing Sheets

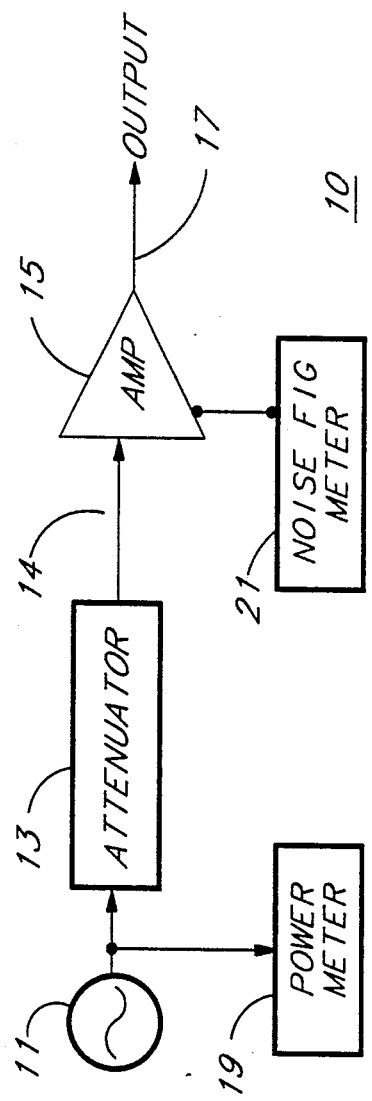
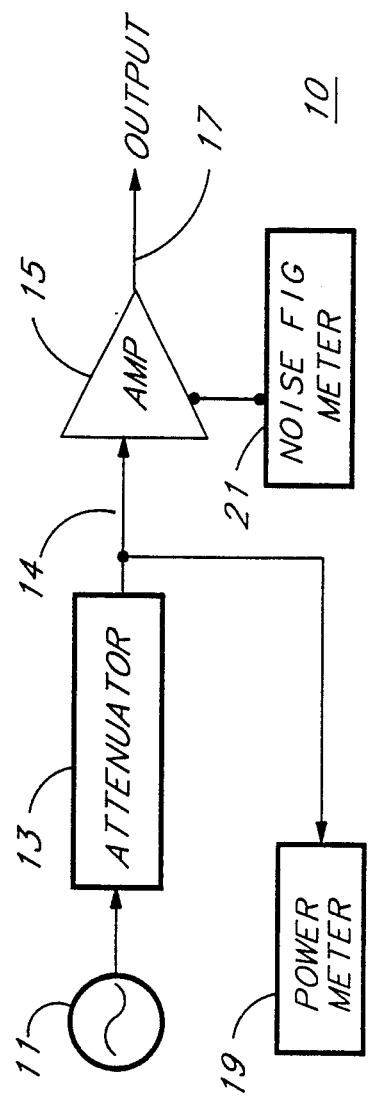

METHOD AND APPARATUS FOR SETTING THE SIGNAL-TO-NOISE RATIO OF A CARRIER WAVE

BACKGROUND OF THE INVENTION

The present invention is related to systems for measuring the signal-to-noise ratio of a carrier wave and more particularly to a system for providing a carrier wave having a predetermined signal-to-noise ratio.

The signal-to-noise ratio of a carrier signal serves as a figure of merit for the performance of communications systems. As the signal-to-noise ratio increases, it becomes easier to distinguish and to reproduce the modulating, or other signal of interest, without error or confusion. Apparatus for measuring the signal-to-noise ratio of a carrier signal is well known in the art and finds particular application in the communications field and in the electronic testing equipment related thereto. U.S. Pat. No. 4,605,904 entitled "Phase Lock Loop Frequency Demodulator Having an Adjustable Bandwidth", issued to Mohammed Hajj-Chehade on Aug. 12, 1986 discloses a sampling circuit for taking a sample of a demodulated signal from the output of a demodulator at the start of a synchronizing signal at which time the demodulated signal is exclusively composed of noise. The sampling circuit provides a reliable and accurate measurement of the noise at the demodulator output by measuring the noise in the absence of a signal rather than measuring the signal to noise ratio in the presence of a useful signal. U.S. Pat. Nos. 4,630,117 and 3,775,689 provide additional examples of known prior art signal-provide to-noise ratio measuring systems.

One of the problems in the prior art is the lack of a system for providing a precise signal-to-noise ratio standard to calibrate and verify signal-to-noise measurement systems.

SUMMARY OF THE INVENTION

It is an object of the present invention to provide a signal source which produces a carrier wave having a precisely set signal-to-noise ratio.

It is a further object of the present invention to provide a system for setting the signal-to-noise ratio of a carrier signal having relatively low cost and complexity.

It is still a further object of the present invention to provide a precision signal noise ratio standard which may be used to calibrate and/or verify a total noise signal-to-noise measurement system, a phase noise measurement system or an amplitude modulation noise measurement system.

The present invention accomplishes these and other objects by providing apparatus comprising a frequency generator for providing a carrier wave, an attenuator, an amplifier and a means of measuring the input power to said amplifier, which apparatus provides an output carrier wave having a predetermined precisely known signal-to-noise ratio which is a function only of the input power to the amplifier nd the amplifier noise figure. The thermal noise of the attenuator is a function of the temperature of the system and of the bandwidth of the measurement system. The attenuation factor of the attenuator is set such that the sideband noise around the carrier signal will be attenuated substantially below the level of the thermal noise floor of the attenuator thereby masking the sideband noise in the thermal noise of the attenuator. Both the carrier signal and the attenuator thermal noise will be equally amplified in the amplifier thus providing a carrier wave having a signal-to-noise ratio equal to the ratio of the power of the carrier wave to the power of the thermal noise of the attenuator and the amplifier. The attenuator noise is a function of system temperature and bandwidth; by measuring the carrier signal power into the amplifier and the amplifier noise figure the precise signal-to-noise ratio may be determined.

BRIEF DESCRIPTION OF THE DRAWINGS

The following description which is given by way of non-limiting example with reference to the accompanying drawings will make it better understood how the invention may be put into effect.

FIG. 1A is a block diagram illustrating a carrier wave signal source according to the principles of the present invention.

FIG. 1B is a block diagram illustrating an alternate implementation of the carrier wave source of FIG. 1B.

DETAIL DESCRIPTION OF THE PREFERRED EMBODIMENT

Figure 2A:
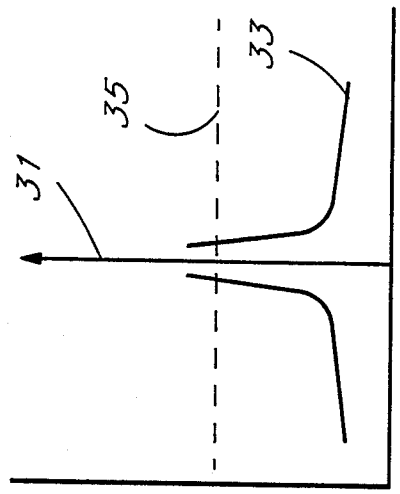
FIGS. 2A and 2B are graphical representations of a carrier wave and its accompanying sideband noise at the input and output, respectfully, of the attenuator of FIGS. 1A and 1B.

Referring now to FIGS. 1A and 1B, a system 10 which provides a carrier signal having a setable, precisely known signal-to-noise ratio is shown. The system 10 comprises signal generator 11 which generates a carrier wave, attenuator 13 having a predetermined attenuation factor and amplifier 15 having a known noise factor and provides a carrier signal having a precisely set signal-to-noise ratio at the output 17. The carrier signal power at the input 14 of amplifier 15 is measured by a signal analyzer or power meter 19 at the output of attenuator 13. Alternatively, the carrier signal power may be measured by power meter 19 at the input of the attenuator 13. Noise figure meter 21 measures the noise figure of the amplifier 15. For example, the input power of the carrier signal at input 14 may be measured with a Hewlett-Packard Company model HP8902A measuring receiver and the noise figure of the amplifier 15 may be measured with a Hewlett-Packard Company model HP8970A noise figure meter.

The signal-to-noise ratio of the carrier wave at output 17 is set by attenuating the carrier signal generated by signal generator 11 such that the carrier signal sideband noise is attenuated below the thermal noise floor level of attenuator 13, thus obscuring the carrier wave sideband noise by the thermal noise of the attenuator 13. If the carrier signal power is measured at the input 14 of amplifier 15 (output of attenuator 13), it is not required that the attenuation factor of the attenuator 13 be known. The only requirement being that the carrier signal sideband noise components be attenuated below the attenuator 13 thermal noise floor. The attenuated carrier wave and the thermal noise of the attenuator 13 are then amplified together by amplifier 15 to provide a usable carrier signal level having precisely known signal-to-noise ratio at the output 17.

If the signal generator 11 provides a carrier wave having noise sideband components at a level below the thermal noise floor level of the amplifier 15, attenuation of the carrier wave and its noise sidebands is not required and the carrier wave may be input directly to the amplifier 15 thus eliminating the attenuator 13 from the system 10.

It may be shown that the total thermal noise floor level ($P_{NT}$) of the attenuator 13 is given by:

$$P_{NT} = KTB$$

where
K = Boltzmann's Constant ($1.374 \times 10^{-23}$ Joules/°K)
T = Measurement Temperature (°K)
B = Measurement Bandwidth The noise figure of amplifier 15 is the ratio of the output noise referred back to the input divided by the thermal noise of the input termination. The noise figure of a linearly operating amplifier is given by the expression:

$$NF(dB) = 10 \log \frac{P_{out}}{KTBG} \text{ (dB)}$$

where
NF = noise figure
$P_{out}$ = Output noise power with input terminated
K = Boltzmann's Constant
T = Temperature (°K)
B = Measurement Bandwidth
G = Amplifier Gain A noiseless amplifier would have a noise figure of zero; i.e., all the noise appearing at the output 17 would result from the noise generated by the input 14 termination. The thermal noise power of the input 14 termination is given by:

$$P_{NT} = KTB$$

where
K = Boltzmann's Constant
T = Temperature (°K)
B = Measurement Bandwidth

The signal-to-noise ratio (S/N) of total noise is equivalent to:

S/N = Thermal noise floor (dBm/Hz) + noise figure (dB) − amplifier input power (dBm).

This analysis assumes that the thermal noise is comprised of two equal components, amplitude modulation thermal (AM) noise and thermal phase noise and further that the two are equal in level and 3 dB below the total noise floor level. Assuming a room temperature of 290° K. and a bandwidth of one Hz, then the total noise power of the input 14 termination is given by $P_{NT} = -174$ dBm which gives a input termination noise power of −177 dBm for the thermal phase noise floor and for the thermal AM noise floor. Then at room temperature, the signal-to-noise ratio for AM noise is given by:

M(f) = Thermal AM noise floor (dBm/Hz) + noise figure (dB) − amplifier input power (dBm).

The signal-to-noise ratio for thermal phase noise is given by:

L(f) = −177(dBm/Hz) + NF(dB) − $P_i$ (dBm)

where
$P_i$ is the power (dBm) of the carrier signal at the amplifier input 14.

Therefore, for a system 10 having an amplifier 15 with a known noise figure, the signal-to-noise ratio is set by the signal power at the input 14 of the amplifier 15 (the signal power out of the attenuator 13) and the noise figure of the amplifier 15 at the temperature of the system 10.

Figure 2B:
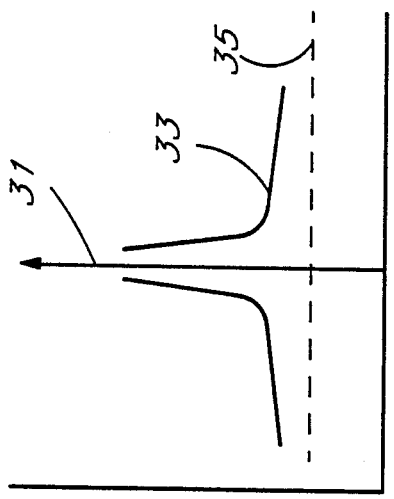
Figure 3B:
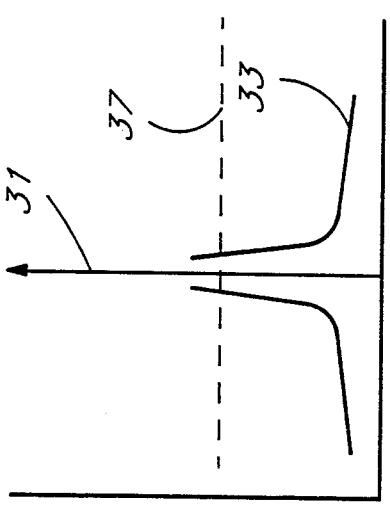

Referring now also to FIGS. 2A, 2B, 3A and 3B, the following example is given. For this example it is assumed that the carrier signal 31 output by the signal generator 11 has a level of +5 dBm and has sideband noise 33 of −155 dBm/Hz. For 40 dB or more of attenuation the thermal noise floor is essentially identical to the thermal noise of a termination (KTB) provided that the attenuator and the termination are at the same temperature T. Therefore, the thermal noise floor level 35 of the attenuator 13 is calculated to be −174 (dBm/Hz). If the attenuator 13 has an attenuation of −60 (dB), both the carrier signal 31 and the sideband noise 33 will be equally attenuated in level when passed through the attenuator 13. The carrier signal sideband noise will be attenuated to a level substantially below that of the attenuator 13 thermal floor 35 as shown in FIG. 2B. Provided that the thermal noise of the attenuator 13 is much larger than the sideband noise 33, the sideband noise will be dominated by the thermal noise 35 of the attenuator. At the input 14 of amplifier 15 then, the signal-to-noise ratio is essentially the ratio of the carrier signal 31 power to the thermal noise 35 power of the attenuator 13.

As defined inhereabove the noise figure is the ratio of the output noise of an amplifier referred back to the input divided by the thermal noise floor of the input termination:

$$P_{out} = NF * KTBG.$$

Noise power referred to the input is given by $$\frac{P_{out}}{G} \text{ (dB)} = 10 \log NF + 10 \log KTB$$
$$= 10 \log NF - 174 \text{ dBm/Hz}$$

From the above equation for the noise figure of an amplifier it is seen that the noise figure is equal to the amount of signal-to-noise degradation produced by the amplifier which raises the thermal noise floor by the amplifier noise figure. Therefore the amplifier may be modeled as having an input thermal noise floor raised by its noise figure and followed by an ideal (i.e., quiet) amplifier.

Figure 3A:
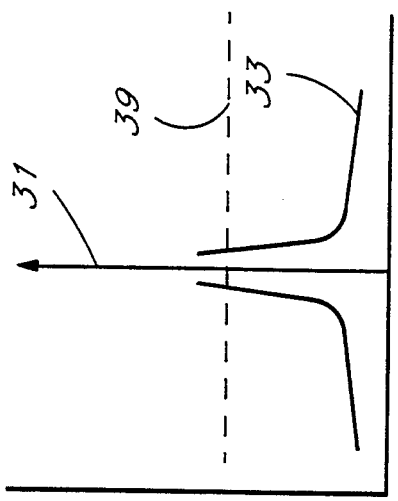
FIGS. 3A and 3B are graphical representations of the carrier wave and its accompanying sideband phase noise at the input and output, respectfully, of the amplifier of FIGS. 1A and 1B.

Returning to the example, if amplifier 15 has a noise figure of +5 dB (the noise figure of amplifier 15 may be measured by noise figure meter 21), the thermal noise floor level 35 will be increased by the noise figure of 5 dB as shown in FIG. 3A resulting in a thermal noise floor 37 of −169 dBm/Hz. Now adding the ideal amplifier gain of 60 dB the carrier signal 31 at output 17 will have a power of +5 dBm and a thermal noise floor level 39 of −109 dBm/Hz which provides a signal-to-noise ratio of 114 dB/Hz for this example. Since the AM and phase noise components are equal and 3 dB less than the total noise, for this example the AM and phase noise components are −117 dB/Hz.

Therefore, it is clear that by adjusting the power level of the carrier wave 31 generated by signal generator 11 and with the operating system 10 at a known temperature and the carrier sideband noise much less than the attenuator 13 thermal noise floor, the signal-to-noise ratio of the carrier signal at output 17 will be precisely set by the level of the carrier signal power generated by the signal generator 11.

While we have described above the principles of our invention in connection with specific apparatus, it is to be understood that this description is made only by way of example and not as a limitation to the scope of our invention as set forth in the accompanying claims.

We claim:

1. A method for setting the signal-to-noise ratio of a carrier wave having sideband noise components, said method comprising the steps of:
   attenuating said carrier wave and said sideband noise components to a level such that said sideband noise components are attenuated substantially below a thermal noise floor level of an attenuator, said thermal noise floor level being a function of the absolute temperature and the measurement bandwidth;
   amplifying said carrier wave, said sideband noise components and said attenuator thermal noise in an amplifier coupled to said attenuator, said amplifier having a known noise figure; and
   adjusting the power level of said carrier wave to provide said carrier wave with a desired signal-to-noise ratio at an output of said amplifier thereby setting said desired signal-to-noise ratio of said carrier wave at said amplifier output.

2. Apparatus for setting the signal-to-noise ratio of a carrier wave having sideband noise components, said apparatus comprising:
   a signal generator for generating said carrier wave having said sideband noise components, said carrier wave having an adjustable, predetermined power level;
   attenuation means coupled to said signal generator for attenuating said carrier wave and said sideband noise components, said attenuation means having a known thermal noise floor level and a predetermined attenuation factor such that said sideband noise components are attenuated substantially below said thermal noise floor level; and
   amplifying means coupled to an output of said attenuation means for amplifying a composite signal comprising said carrier wave, said sideband noise components and said attenuation means thermal noise, said amplifying means having a known noise figure whereby the signal to noise ratio of said carrier wave at the output of said amplifying means is set corresponding to said adjustable, predetermined power level.

3. Apparatus as in claim 2 further including power measuring means coupled to an output of said signal generator for measuring the power level of said carrier wave.

4. Apparatus for determining the signal-to-noise ration of a carrier wave having sideband noise components, said apparatus comprising:
   a signal generator for generating said carrier wave having said sideband noise components;
   attenuation means coupled to said signal generator for attenuating said carrier wave and said sideband noise components to a level such that said sideband noise components are attenuated substantially below a thermal noise floor level of said attenuation means;
   power measuring means coupled to an output of said attenuation means for measuring the power level of said carrier wave; and
   amplifying means coupled to said attenuation means output for amplifying a composite signal comprising said carrier wave, said sideband noise components and said attenuation means thermal noise, said amplifying means having a known noise figure whereby said signal-to-noise ratio of said carrier wave at the output of said amplifier means is determined as a function of said measured power level.

5. A method for determining the signal-to-noise ratio of a carrier wave having sideband noise components, said method comprising the steps of:
   generating a carrier wave having a sideband noise components, said carrier wave having a known power level;
   attenuating said carrier wave and said sideband noise components to a level such that said sideband noise components are attenuated substantially below a thermal noise floor level of an attenuation means, said attenuation means having a known attenuation factor; and
   amplifying said carrier wave, said sideband noise components and said attenuation means thermal noise in an amplifier means coupled to said attenuation means, said amplifier means having a known noise figure thereby determining the signal-to-noise ratio of said carrier wave, at the output of said amplifier means, as a function of said known power level.

6. A method as in claim 5 including the step of measuring said carrier wave power level at an input to said attenuation means.

7. A method for determining the signal-to-noise ratio of a carrier wave having sideband noise components, said method comprising the step of amplifying said carrier wave in a amplifier having a known noise figure said carrier wave having a known power level and said sideband noise components are at a level below a thermal noise floor level of said amplifier, said thermal noise floor level set by said amplifier noise figure thereby determining the signal-to-noise ratio of said carrier wave, at the output of said amplifier means, as a function of said known power level.

8. A method as in claim 7 including the step of measuring said carrier wave power level at an input to said amplifier.

9. A method as in claim 1 including the step of measuring the power level of said carrier wave at an input of said attenuator.

10. A method as in claim 1 including the step of measuring the power level of said attenuated carrier wave at an output of said attenuator.

11. Apparatus as in claim 2 further including power measuring means coupled to an output of said attenuation means for measuring the power level of said attenuated carrier wave.

12. A method as in claim 5 including the step of measuring the power level of said attenuated carrier wave at an output of said attenuation means.

* * * * *